(12) United States Patent
Li

(10) Patent No.: US 11,018,219 B2
(45) Date of Patent: May 25, 2021

(54) P-TYPE MOSFET AND METHOD FOR MANUFACTURING SAME

(71) Applicant: Shanghai Huali Integrated Circuit Corporation, Shanghai (CN)

(72) Inventor: Zhonghua Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 16/704,335

(22) Filed: Dec. 5, 2019

(65) Prior Publication Data

US 2021/0043725 A1 Feb. 11, 2021

(30) Foreign Application Priority Data

Aug. 5, 2019 (CN) .......................... 201910716589.8

(51) Int. Cl.
| | |
|---|---|
| *H01L 29/06* | (2006.01) |
| *H01L 21/266* | (2006.01) |
| *H01L 21/324* | (2006.01) |
| *H01L 29/10* | (2006.01) |
| *H01L 29/66* | (2006.01) |
| *H01L 29/78* | (2006.01) |

(52) U.S. Cl.
CPC ........ *H01L 29/0615* (2013.01); *H01L 21/266* (2013.01); *H01L 21/324* (2013.01); *H01L 29/1054* (2013.01); *H01L 29/1079* (2013.01); *H01L 29/66492* (2013.01); *H01L 29/7833* (2013.01)

(58) Field of Classification Search
CPC ............. H01L 29/0615; H01L 29/1054; H01L 29/1079; H01L 29/66492; H01L 21/324; H01L 21/266; H01L 29/7833
See application file for complete search history.

(56) References Cited

U.S. PATENT DOCUMENTS

| | | | |
|---|---|---|---|
| 9,613,805 B1* | 4/2017 | Schustereder | ........ H01L 21/324 |
| 2010/0003799 A1* | 1/2010 | Lee | ..................... H01L 21/2652 |
| | | | 438/305 |

* cited by examiner

*Primary Examiner* — Syed I Gheyas
(74) *Attorney, Agent, or Firm* — Banner & Witcoff, Ltd.

(57) ABSTRACT

The invention discloses a P-type MOSFET, a channel region consisting of an N-well is formed in the semiconductor substrate covered with a gate structure; the N-well is formed by overlaying an annealed phosphorus-implanted region, an annealed first arsenic-implanted region and an annealed second arsenic-implanted region, and the first arsenic-implanted region and the second arsenic-implanted region are overlaid to form a threshold voltage regulation region; the implantation depth of the first arsenic-implanted region is greater than that of the second arsenic-implanted region; and an amorphous layer is formed by the first arsenic-implanted region on the semiconductor substrate to improve the implantation uniformity of the second arsenic-implanted region and to decrease the peak surface doping concentration of the second arsenic-implanted region located on the surface of the semiconductor substrate. The invention further discloses a method for manufacturing a P-type MOSFET. The invention can reduce the flicker noises of a device.

15 Claims, 6 Drawing Sheets

P-TYPE MOSFET AND METHOD FOR MANUFACTURING SAME

CROSS REFERENCE TO RELATED APPLICATIONS

The present application claims priority to and the benefit of Chinese Patent Application No. 201910716589.8 filed on Aug. 5, 2019, the disclosure of which is incorporated herein by reference in its entirety as part of the present application.

BACKGROUND

The invention relates to the field of manufacturing of semiconductor integrated circuits, in particular to a P-type MOSFET and a method for manufacturing the P-type MOSFET.

As shown in FIG. 1A-FIG. 1E which are device structural diagrams of all steps of an existing method for manufacturing a P-type MOSFET, the existing method for manufacturing a P-type MOSFET comprises the following steps:

As shown in FIG. 1A, a semiconductor substrate 101 is provided, wherein the semiconductor substrate 101 is a silicon substrate; a field oxide 102 is formed on the semiconductor substrate 101, an active region is defined by the field oxide 102, and a P-type MOSFET is formed in the active region.

A pad oxide 201 is formed on the surface of the semiconductor substrate 101.

As shown in FIG. 1B, deep N-well 103 ion implantation is carried out to form a deep N-well 103, wherein the deep N-well 103 ion implantation penetrates through the pad oxide 201 and is shown by arrow lines corresponding to reference sign 202 in FIG. 1B.

As shown in FIG. 1C, after the deep N-well 103 ion implantation, an ion-implanted region of the deep N-well 103 is generally annealed. As shown in FIG. 1C, the deep N-well 103 is formed in the whole region of the semiconductor substrate 101, the semiconductor substrate 101 further has a part not formed with the deep N-well at the bottom of the deep N-well 103, and the part, at the bottom of the deep N-well 103, of the semiconductor substrate 101 is not shown.

As can be seen from FIG. 1C, the compactness of the pad oxide 201 is destroyed after the deep N-well 103 ion implantation, and the pad oxide with poor compactness is independently represented by reference sign 201a in FIG. 1C.

Afterwards, as shown in FIG. 1D, ion implantation 203 of an N-well 104 is carried out, wherein the ion implantation 203 of the N-well 104 penetrates through the pad oxide 201a. In the existing method, the ion implantation 203 of the N-well 104 includes phosphorus implantation and one time of arsenic implantation, wherein the arsenic implantation is used to form a threshold voltage regulation region.

Afterwards, as shown in FIG. 1E, the N-well 104 is annealed to be driven in.

After the N-well 104 is formed, the method further comprises the following steps:

A gate structure of the P-type MOSFET is formed, wherein the gate structure of the P-type MOSFET is formed by overlaying a gate dielectric layer and a gate conductive material layer, the gate dielectric layer is formed on the surface of the semiconductor substrate 101, a channel region is formed by an N-well 104 part covered with the gate structure, and an inversion channel is formed by the surface of the channel region covered with the gate structure.

P-type heavily-doped source-drain implantation is carried out to form a source region and a drain region, which are formed by P+ regions, in the active region on two sides of the gate structure separately.

A contact hole, an interlayer film and a front metal layer are formed.

The P-type MOSFET, such as a 28LP PMOS input-output (IO) device, formed through the existing method has high flicker noises, for example, low-frequency flicker noises always exceed the upper limit; and due to the excessively large area of the device, the flicker noise suppression effect based on improvements of the interface state, IO shallow doping, lightly-doped drain (LDD) annealing temperature is not significant.

BRIEF SUMMARY

The technical issue to be settled by the invention is to provide a P-type MOSFET capable of reducing reduce flicker noises of a device, and a method for manufacturing a P-type MOSFET.

To settle the above technical issue, the P-type MOSFET provided by the invention comprises:

A gate structure formed by overlaying a gate dielectric layer and a gate conductive material layer, wherein:

The gate dielectric layer is formed on the surface of a semiconductor substrate, a channel region consisting of an N-well is formed in the semiconductor substrate covered with the gate structure, and an inversion channel is formed in the surface of the channel region covered with the gate structure;

The N-well comprises a phosphorus-implanted region, a first arsenic-implanted region and a second arsenic-implanted region; and after being annealed, the phosphorus-implanted region, the first arsenic-implanted region and the second arsenic-implanted region are overlaid to form the N-well, and the first arsenic-implanted region and the second arsenic-implanted region are overlaid to form a threshold voltage regulation region in the channel region; and The implantation depth of the first arsenic-implanted region is greater than that of the second arsenic-implanted region, and an amorphous layer is formed by the first arsenic-implanted region on the semiconductor substrate within the implantation depth of the first arsenic-implanted region to improve the implantation uniformity of the second arsenic-implanted region and to decrease the peak doping concentration of the second arsenic-implanted region located on the surface of the semiconductor substrate, so that flicker noises are reduced.

Furthermore, a first sacrificial oxide is used for ion implantation of the phosphorus-implanted region, the first arsenic-implanted region and the second arsenic-implanted region of the N-well and is formed on the semiconductor substrate, and the first sacrificial oxide has a compact structure that is not affected by ion implantation carried out before the ion implantation of the phosphorus-implanted region, the first arsenic-implanted region and the second arsenic-implanted region of the N-well, so that the uniformity of the ion implantation of the phosphorus-implanted region, the first arsenic-implanted region and the second arsenic-implanted region of the N-well is improved; and the first sacrificial oxide is removed after the N-well is formed.

Furthermore, a deep N-well is formed in the semiconductor substrate, the N-well is formed in the deep N-well, and the deep N-well is formed by an annealed deep N-well implantation region; and Ion implantation of the deep N-well implantation region penetrates through a pad oxide, and the pad oxide is removed before the ion implantation of the deep N-well implantation region and before the formation of the first sacrificial oxide.

Furthermore, the semiconductor substrate is a silicon substrate.

Furthermore, a field oxide is formed on the semiconductor substrate, an active region is defined by the field oxide, and the P-type MOSFET is formed in the active region.

Furthermore, the gate dielectric layer is made from silicon oxide, silicon oxynitride, or a high-dielectric constant material, and the high-dielectric constant material includes hafnium oxide; and The gate conductive material layer is a polysilicon gate; or, the gate conductive material layer is a metal gate.

Furthermore, a source region and a drain region, which are formed by P+ regions, are formed in the active region on two sides of the gate structure, and the gate conductive material layer, the source region and the drain region are connected to a front metal layer via contact holes.

To settle the above technical issue, a gate structure of a P-type MOSFET involved in the method for manufacturing a P-type MOSFET provided by the invention is formed by overlaying a gate dielectric layer and a gate conductive material layer, wherein the gate dielectric layer is formed on the surface of a semiconductor substrate, a channel region consisting of an N-well is formed in the semiconductor substrate covered with the gate structure, and an inversion channel is formed in the surface of the channel region covered with the gate structure; and the N-well is formed through the following steps:

Step 1, carrying out primary phosphorus implantation to form a phosphorus-implanted region;

Step 2, carrying out secondary arsenic implantation to form a first arsenic-implanted region, wherein the implantation depth of the secondary arsenic implantation is greater than that of subsequent ternary arsenic implantation, and an amorphous layer is formed by the first arsenic-implanted region on the semiconductor substrate within the implantation depth of the first arsenic-implanted region;

Step 3, carrying out the ternary arsenic implantation to form a second arsenic-implanted region, wherein the amorphous layer improves the uniformity of the ternary arsenic implantation and decreases the peak doping concentration of the second arsenic-implanted region located on the surface of the semiconductor substrate, so that flicker noises are reduced; and Step 4, carrying out an annealing process, overlaying the annealed phosphorus-implanted region, first arsenic-implanted region and second arsenic-implanted region to form the N-well, and overlaying the first arsenic-implanted region and the second arsenic-implanted region to form a voltage threshold regulation region in the channel region.

Furthermore, the method further comprises the following steps performed before the primary phosphorus implantation in Step 1:

Removing a pre-existing oxide layer on the surface of the semiconductor substrate, and then forming a first sacrificial oxide on the surface of the semiconductor substrate to eliminate the influence of ion implantation carried out before the primary phosphorus implantation on the first sacrificial oxide to make sure that the first sacrificial oxide has a compact structure;

Carrying out the primary phosphorus implantation in Step 1 after the first sacrificial oxide is formed, wherein the subsequent primary phosphorus implantation, secondary arsenic implantation and ternary arsenic implantation all penetrate through the first sacrificial oxide to penetrate into the semiconductor substrate, and because the first sacrificial oxide has a compact structure that is not affected by ion implantation carried out before the primary phosphorus implantation, the uniformity of the primary phosphorus implantation, the secondary arsenic implantation and the ternary arsenic implantation is improved; and Removing the first sacrificial oxide after the annealing process in Step 4 is completed.

Furthermore, the first sacrificial oxide grows by a wet-oxygen oxidization process at a temperature of 1000° C.-1300° C. and has a thickness of 10 Å-100 Å.

Furthermore, before the first sacrificial oxide is formed, the method further comprises the step of forming a deep N-well in the semiconductor substrate through following sub-steps:

Forming a pad oxide on the surface of the semiconductor substrate;

Carrying out deep N-well ion implantation to form the deep N-well, wherein the deep N-well ion implantation penetrates through the pad oxide; and Removing the pad oxide as a pre-existing oxide layer before the first sacrificial oxide is formed.

Furthermore, the semiconductor substrate is a silicon substrate; and

The method further comprises the step of forming a field oxide on the semiconductor substrate before Step 1, wherein an active region is defined by the field oxide, and the P-type MOSFET is formed in the active region.

Furthermore, the method further comprises the following steps to be performed after Step 4:

Step 5, sequentially forming the gate dielectric layer and the gate conductive material layer on the surface of the semiconductor substrate;

Step 6, defining a formation region of the gate structure by lithography;

Step 7, sequentially etching the gate conductive material layer and the gate dielectric layer, and overlaying the etched gate dielectric layer and the etched gate conductive material layer to form the gate structure;

Step 8, forming a primary gate spacer, and carrying out P-type lightly-doped drain (LDD) implantation to form lightly-doped drain regions in the active region on two sides of the gate structure separately; then forming a secondary gate spacer, and carrying out P-type heavily-doped source-drain implantation to form a source region and a drain region, which are formed by P+ regions, in the active region on the two sides of the gate structure separately; and Step 9, growing metal silicide such as nickel silicide, and forming contact holes, an interlayer film and front metal layers.

Furthermore, the pre-existing oxide layer and the first sacrificial oxide are removed by a wet removal process or a plasma removal process.

Furthermore, the implantation energy of the primary phosphorus implantation is 100 KeV-300 KeV, and the implantation dose is $1*10^{13}$ cm-2-$1*10^{14}$ cm-2;

The implantation energy of the secondary arsenic implantation is 100 KeV-200 KeV, and the implantation dose is $1*10^{12}$ cm-2-$5*10^{14}$ cm-2;

The implantation energy of the ternary arsenic implantation is 50 KeV-100 KeV, and the implantation dose is $1*10^{12}$ cm-2-$5*10^{14}$ cm-2; and The temperature of the annealing process in Step 4 is 1000° C.-1300° C.

In the invention, the structure of the doped region of the N-well forming the channel region is specially designed by dividing an arsenic-implanted region constituting the threshold voltage regulation region into the first arsenic-implanted region and the second arsenic-implanted region, wherein the implantation depth of the first arsenic-implanted region is greater than that of the second arsenic-implanted region, the amorphous layer is formed by the first arsenic-implanted region on the semiconductor substrate within the implantation depth of the first arsenic-implanted region, so that the implantation uniformity of the second arsenic-implanted region is improved, and the peak surface doping concentration of the second arsenic-implanted region located on the surface of the semiconductor substrate is decreased; and the improvement of the implantation uniformity of the second arsenic-implanted region and the decrease of the peak surface doping concentration of the second arsenic-implanted region on the surface of the semiconductor substrate reduce flicker noises; wherein the improvement of the implantation uniformity of the second arsenic-implanted region improves the distribution uniformity of carriers in a channel formed in the channel region and reduces fluctuations of the number of the carriers, so that the flicker noises are further reduced; the decrease of the peak surface doping concentration of the second arsenic-implanted region on the surface of the semiconductor substrate makes carriers formed after inversion of the channel region further away from the surface of the channel (namely the bottom surface of the gate dielectric layer), so that the probability of trap capture and hole release in the gate dielectric layer is lowered, surface scattering of the carriers is reduced, and the flicker noises are reduced accordingly.

In the invention, the structure of the sacrificial oxide (namely the first sacrificial oxide) allowing ion implantation of the N-well to penetrate through is further designed to make sure that the first sacrificial oxide has a compact structure that is not affected by ion implantation carried out before the ion implantation of the phosphorus-implanted region, the first arsenic-implanted region and the second arsenic-implanted region of the N-well, so that the uniformity of the ion implantation of the N-well is improved, the doping distribution of the phosphorus-implanted region, and the first arsenic-implanted region and the second arsenic-implanted region constituting the N-well is more uniform, and the flicker noises are further reduced.

In general, the N-well is formed in the deep N-well, and the deep N-well ion implantation penetrates through the pad oxide; different from the prior art directly using a pad oxide corresponding to a deep N-well as an sacrificial oxide allowing ion implantation of the N-well to penetrate through, in the invention, the pad oxide is removed before the formation of the first sacrificial oxide, so that compared with the prior art in which the pad oxide is used as the sacrificial oxide allowing the ion implantation of the N-well to penetrates through and a threshold voltage regulation region is formed by one time of arsenic implantation, the first sacrificial oxide formed after the pad oxide is removed and the threshold voltage regulation region formed by two times of arsenic implantation are adopted, so that the flicker noises of a corresponding device of the invention are reduced by 50%.

BRIEF DESCRIPTION OF THE DRAWINGS

The invention is further detailed below in combination with the accompanying drawings and embodiments.

DETAILED DESCRIPTION

A P-type MOSFET in this embodiment of the invention comprises:

A gate structure formed by overlaying a gate dielectric layer and a gate conductive material layer, wherein:

The gate dielectric layer is formed on the surface of a semiconductor substrate 1, a channel region consisting of an N-well 4 is formed in the semiconductor substrate 1 covered with the gate structure, and an inversion channel is formed in the surface of the channel region covered with the gate structure. The structure of the N-well 4 is shown in FIG. 2J.

Figure 1A:
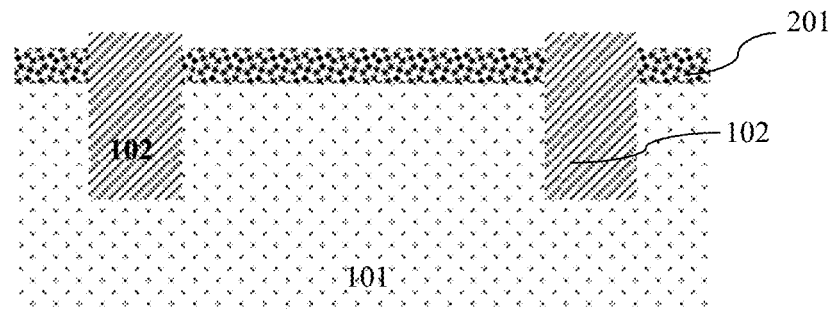
FIG. 1A-FIG. 1E are device structural diagrams of all steps of an existing method for manufacturing a P-type MOSFET.
Figure 1B:
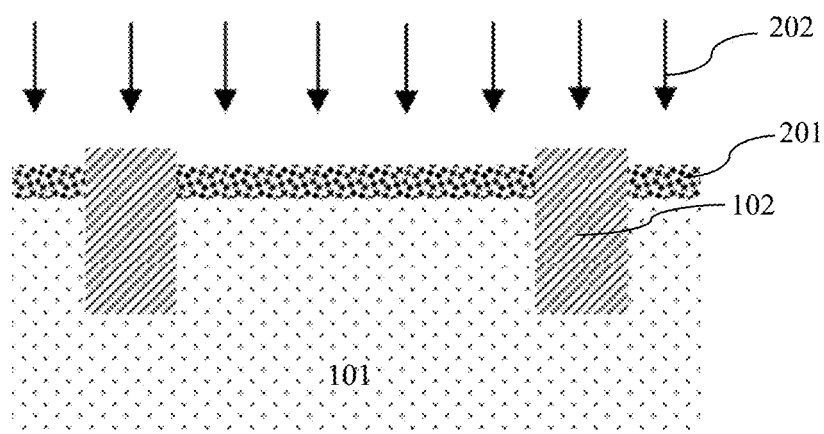
Figure 1C:
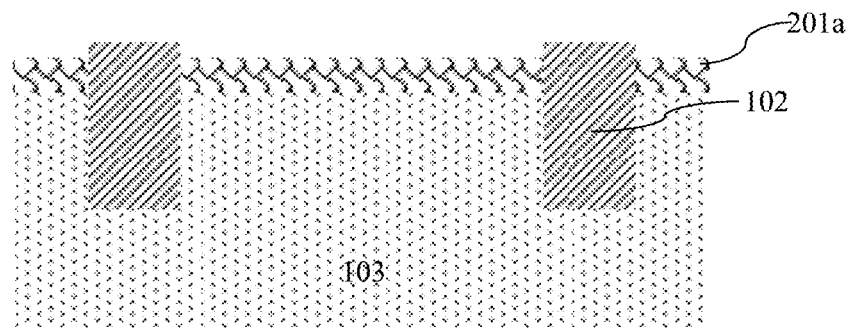
Figure 1D:
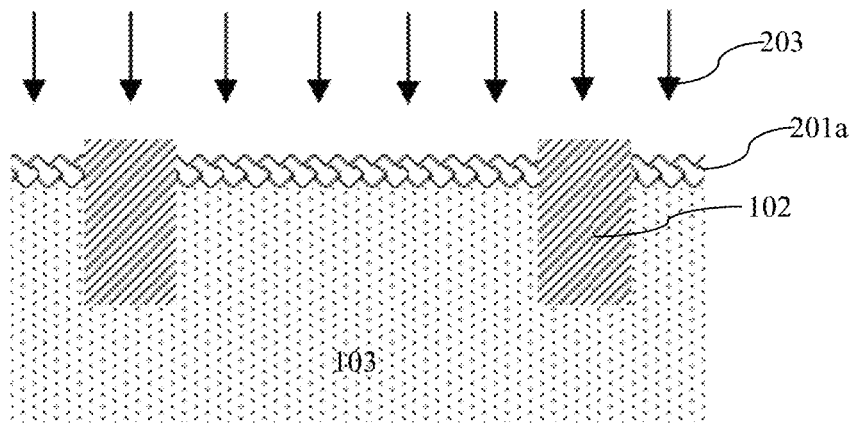
Figure 1E:
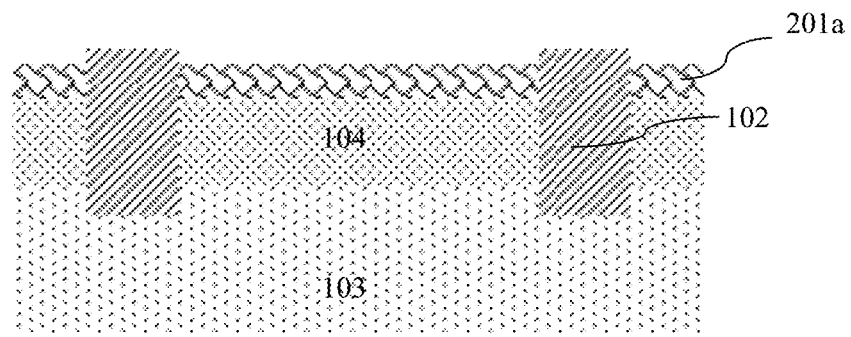
Figure 2A:
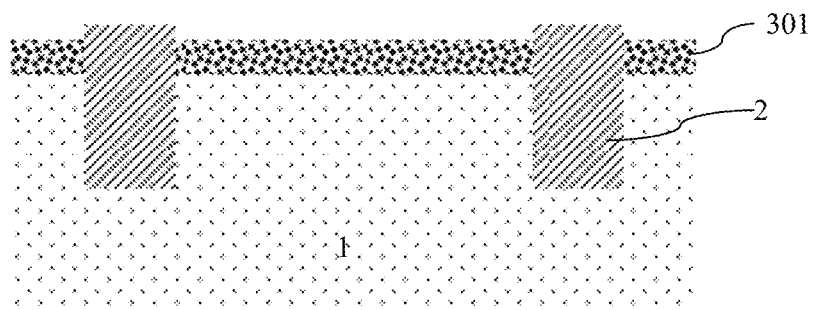
FIG. 2A-FIG. 2J are device structural diagram of all steps of a method for manufacturing a P-type MOSFET in one embodiment of the invention.
Figure 2B:
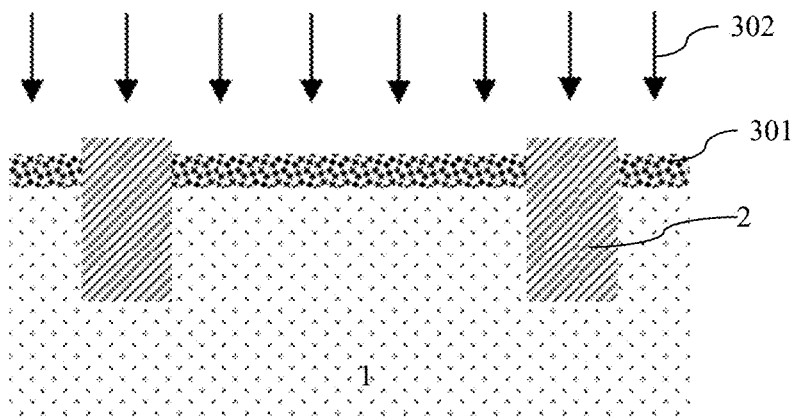
Figure 2C:
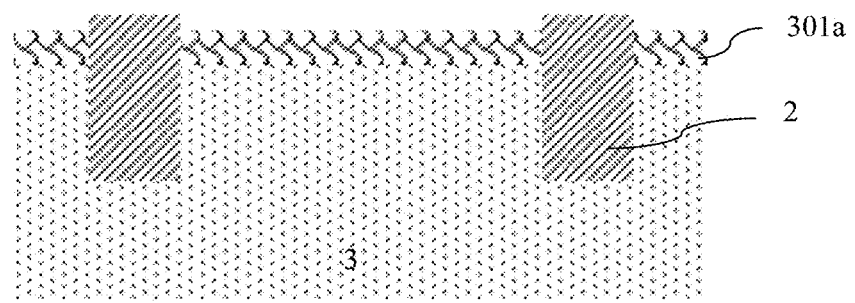
Figure 2D:
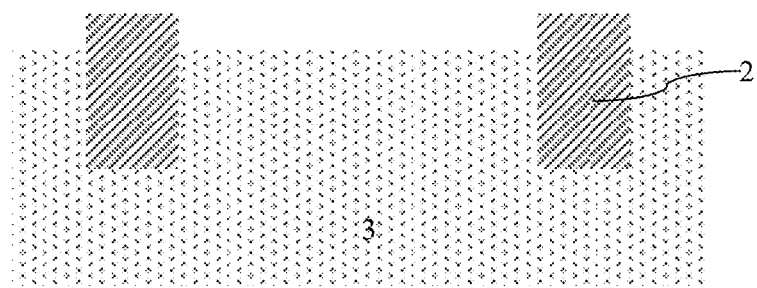
Figure 2E:
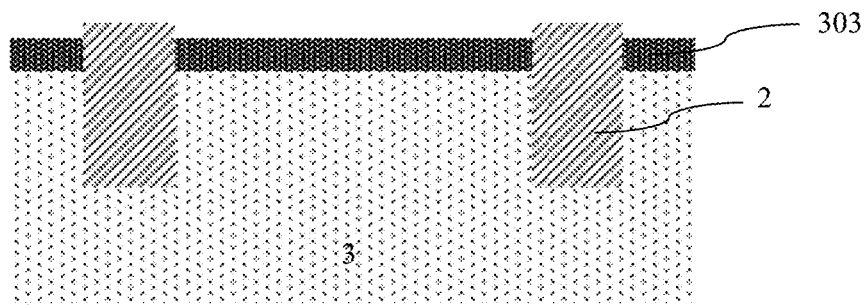
Figure 2F:
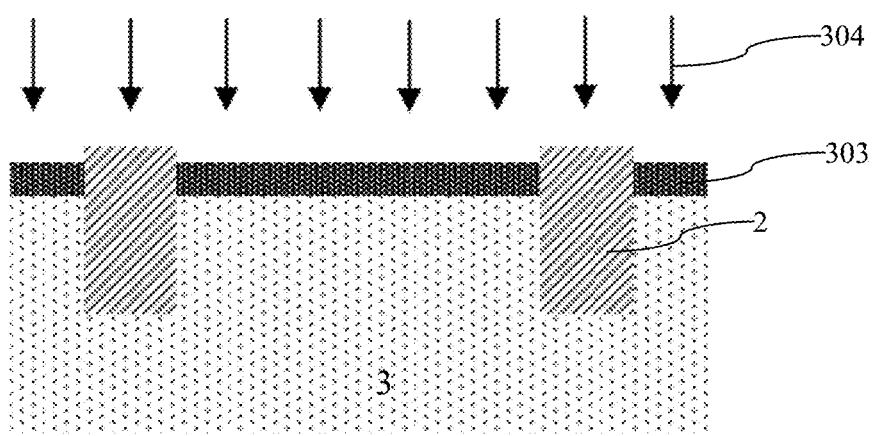
Figure 2G:
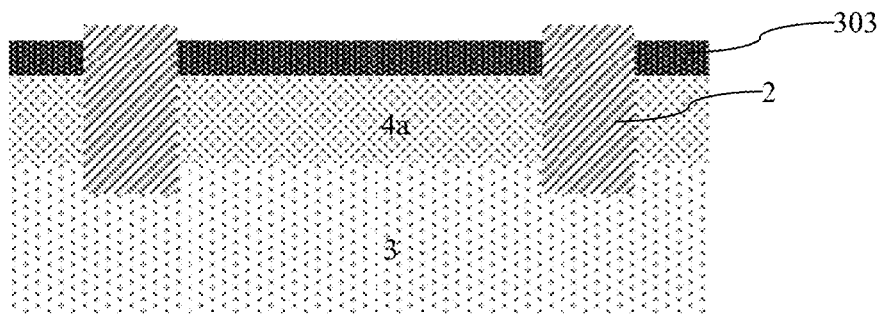
Figure 2H:
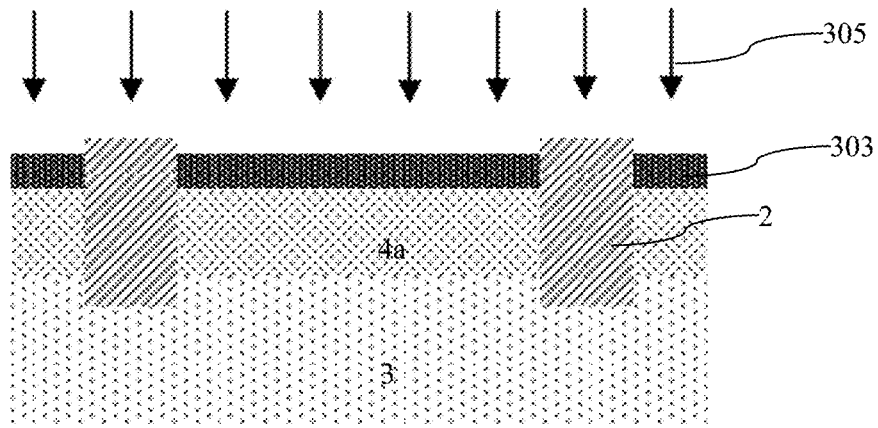

As shown in FIG. 2A, the semiconductor substrate 1 is a silicon substrate. A field oxide 2 is formed on the semiconductor substrate 1, an active region is defined by the field oxide 2, and the P-type MOSFET is formed in the active region.

The gate dielectric layer is made from silicon oxide, silicon oxynitride, or a high-dielectric constant material, and the high-dielectric constant material includes hafnium oxide. The gate conductive material layer is a polysilicon gate; or, the gate conductive material layer is a metal gate.

A source region and a drain region, which are formed by P+ regions, are formed in the active region on two sides of the gate structure, and the gate conductive material layer, the source region and the drain region are connected to a front metal layer via contact holes separately. Metal silicide such as nickel silicide is generally formed on the surface of the source region and the surface of the drain region. When the gate conductive material layer is the polysilicon gate, nickel silicide is also formed on the surface of the polysilicon gate. The front metal layer is made from copper. A plurality of front metal layers is configured in general and connected via through holes. The contact holes and the through holes are typically filled with metallic tungsten. The front metal layers are isolated by interlayer films.

Figure 2I:
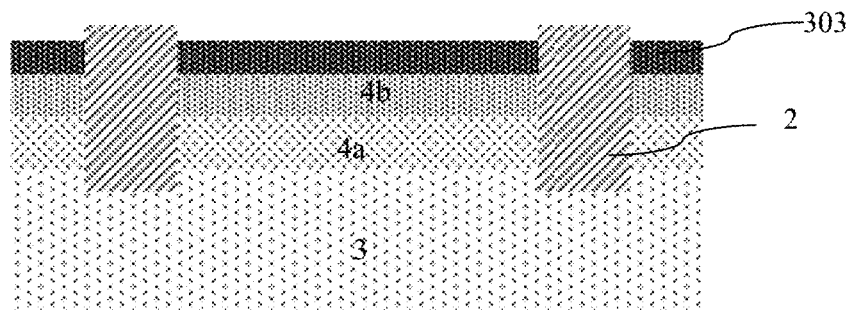
Figure 2J:
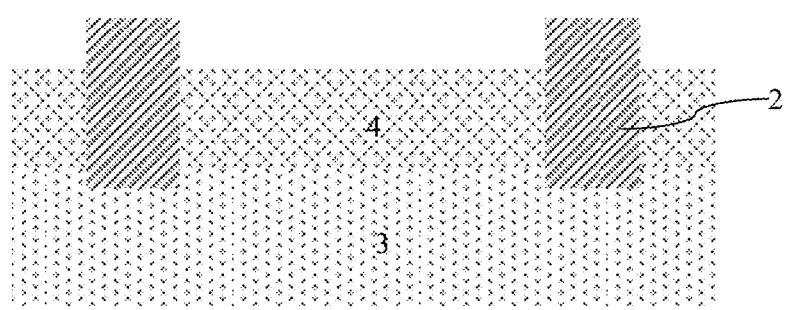

As shown in FIG. 2I, the N-well 4 comprises a phosphorus-implanted region, a first arsenic-implanted region and a second arsenic-implanted region 4b, and a doped region corresponding to reference sign 4a is an overlay structure of the phosphorus-implanted region and the first arsenic-implanted layer; after being annealed, the phosphorus-implanted region, the first arsenic-implanted region and the second arsenic-implanted region 4b are overlaid to form the N-well 4, and the first arsenic-implanted region and the second arsenic-implanted region 4b are overlaid to form a threshold voltage regulation region in the channel region.

The implantation depth of the first arsenic-implanted region is greater than that of the second arsenic-implanted region 4b, an amorphous layer is formed by the first arsenic-implanted region on the semiconductor substrate 1 within the implantation depth of the first arsenic-implanted region to improve the implantation uniformity of the second arsenic-implanted region 4b and to decrease the peak doping concentration of the second arsenic-implanted region 4b located on the surface of the semiconductor substrate 1, and the decrease of the peak doping concentration of the second arsenic-implanted region 4b on the surface of the semiconductor substrate 1 makes carriers in a channel further away from the bottom surface of the gate dielectric layer, so that flicker noises are reduced.

In this embodiment of the invention, a first sacrificial oxide 303 shown in FIG. 2E is used for ion implantation of the phosphorus-implanted region, the first arsenic-implanted region and the second arsenic-implanted region 4b of the N-well 4, and the first sacrificial oxide 303 is formed on the semiconductor substrate 1 and has a compact structure that is not affected by ion implantation carried out before the ion implantation of the phosphorus-implanted region, the first arsenic-implanted region and the second arsenic-implanted region 4b of the N-well 4, so that the uniformity of the ion implantation of the phosphorus-implanted region, the first arsenic-implanted region and the second arsenic-implanted region 4b of the N-well 4 is improved; and the first sacrificial oxide 303 is removed after the N-well 4 is formed.

A deep N-well 3 is formed in the semiconductor substrate 1, the N-well 4 is formed in the deep N-well 3, and the deep N-well 3 is formed by an annealed deep N-well 3 implantation region.

Ion implantation of the deep N-well 3 implantation region penetrates through a pad oxide 301, the structure of the pad oxide 301 is shown in FIG. 2A, and the ion implantation of the deep N-well 3 implantation region is shown by arrow lines corresponding to reference sign 302 in FIG. 2B.

The pad oxide 301 is removed before the ion implantation of the deep N-well 3 implantation region and before the formation of the first sacrificial oxide 303.

In this embodiment of the invention, the structure of the doped region of the N-well 4 forming the channel region is specially designed by dividing an arsenic-implanted region constituting the threshold voltage regulation region into the first arsenic-implanted region and the second arsenic-implanted region, wherein the implantation depth of the first arsenic-implanted region is greater than that of the second arsenic-implanted region 4b, the amorphous layer is formed by the first arsenic-implanted region on the semiconductor substrate 1 within the implantation depth of the first arsenic-implanted region, so that the implantation uniformity of the second arsenic-implanted region 4b is improved, and the peak surface doping concentration of the second arsenic-implanted region 4b located on the surface of the semiconductor substrate 1 is decreased; and the improvement of the implantation uniformity of the second arsenic-implanted region 4b and the decrease of the peak surface doping concentration of the second arsenic-implanted region 4b on the surface of the semiconductor substrate 1 reduce flicker noises; wherein the improvement of the implantation uniformity of the second arsenic-implanted region 4b improves the distribution uniformity of carriers in a channel formed in the channel region and reduces fluctuations of the number of the carriers, so that the flicker noises are further reduced; the decrease of the peak surface doping concentration of the second arsenic-implanted region 4b on the surface of the semiconductor substrate 1 makes carriers formed after inversion of the channel region further away from the surface of the channel (namely the bottom surface of the gate dielectric layer), so that the probability of trap capture and hole release in the gate dielectric layer is lowered, surface scattering of the carriers is reduced, and the flicker noises are reduced accordingly.

In this embodiment of the invention, the structure of the sacrificial oxide (namely the first sacrificial oxide 303) allowing ion implantation of the N-well 4 to penetrate through is further designed to make sure that the first sacrificial oxide 303 has a compact structure that is not affected by ion implantation carried out before the ion implantation of the phosphorus-implanted region, the first arsenic-implanted region and the second arsenic-implanted region 4b of the N-well 4, so that the uniformity of the ion implantation of the N-well 4 is improved, the doping distribution of the phosphorus-implanted region, and the first arsenic-implanted region and the second arsenic-implanted region 4b constituting the N-well 4 is more uniform, and the flicker noises are further reduced.

In general, the N-well 4 is formed in the deep N-well 3, and deep N-well ion implantation penetrates through the pad oxide 301; different from the prior art directly using a pad oxide 301 corresponding to a deep N-well 3 as an sacrificial oxide allowing ion implantation of the N-well 4 to penetrate through, in this embodiment of the invention, the pad oxide 301 is removed before the formation of the first sacrificial oxide 303, so that compared with the prior art in which the pad oxide 301 is used as the sacrificial oxide 301 allowing the ion implantation of the N-well 4 to penetrates through and a threshold voltage regulation region is formed by one time of arsenic implantation, the first sacrificial oxide 303 formed after the pad oxide 301 is removed and the threshold voltage regulation region formed by two times of arsenic implantation are adopted, so that the flicker noises of a corresponding device of the invention are reduced by 50%.

Figure 3:
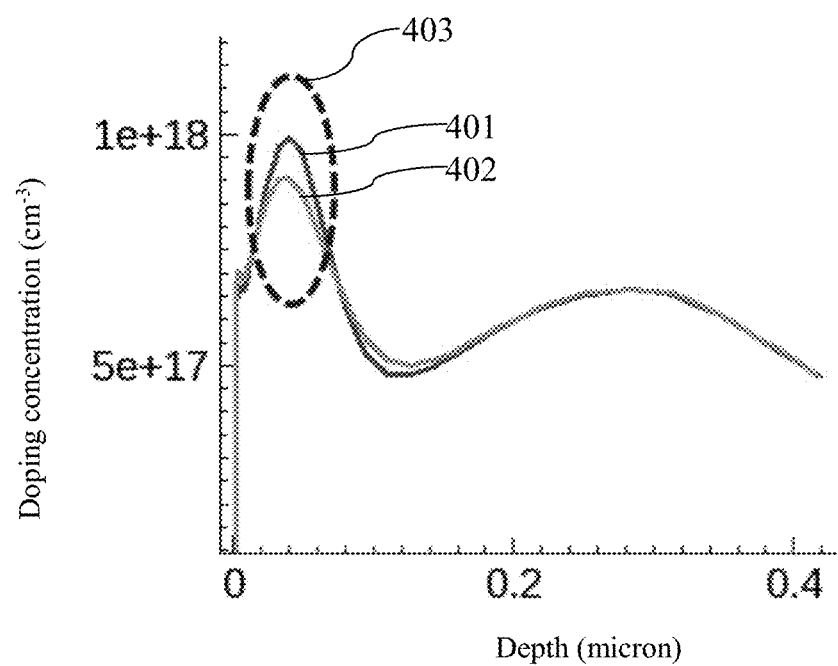
FIG. 3 is a simulation diagram of doping concentration distribution curves in the depth direction of a channel region of the P-type MOSFET in the embodiment of the invention and a channel region of the existing P-type MOSFET.

FIG. 3 is a simulation diagram of doping concentration distribution curves in the depth direction of the channel region of the P-type MOSFET in the embodiment of the invention and the channel region of the existing P-type MOSFET, wherein the horizontal axis represents the depth in micron, the longitudinal axis represents the doping concentration in cm-3, curve 401 is a doping concentration distribution curve in the depth direction of the channel region of the existing P-type MOSFET, curve 402 is a doping concentration distribution curve in the depth direction of the channel region of the P-type MOSFET in this embodiment of the invention, and broken circle 403 corresponding to a region near the surface of the channel region. As can be seen from curve 402, the peak doping concentration of the region on the surface of the channel region is lower, so that carriers formed after inversion of the channel region can be further away from the surface of the channel (namely the bottom surface of the gate dielectric layer), thus lowering the probability of trap capture and hole release in the gate dielectric layer, reducing surface scattering of the carriers is reduced, and accordingly, reducing the flicker noises.

FIG. 2A-FIG. 2J are device structural diagrams of all steps of a method for manufacturing a P-type MOSFET in this embodiment of the invention. As for the method for manufacturing a P-type MOSFET in this embodiment of the invention, a gate structure of a P-type MOSFET is formed by overlaying a gate dielectric layer and a gate conductive material layer, wherein the gate dielectric layer is formed on the surface of a semiconductor substrate 1, a channel region consisting of an N-well 4 is formed in the semiconductor substrate 1 covered with the gate structure, and an inversion channel is formed in the surface of the channel region covered with the gate structure; the N-well 4 is formed through the following steps:

In this embodiment of the invention, before the N-well 4 is formed, the method further comprises the step of forming a deep N-well 3 in the semiconductor substrate 1 through the following sub-steps:

As shown in FIG. 2A, a semiconductor substrate 1 is provided, wherein the semiconductor substrate 1 is a silicon substrate; a field oxide 2 is formed on the semiconductor substrate 1, an active region is defined by the field oxide 2, and the P-type MOSFET is formed in the active region.

A pad oxide 301 is formed on the surface of the semiconductor substrate 1.

As shown in FIG. 2B, deep N-well 3 ion implantation is carried out to form the deep N-well 3, wherein the deep N-well 3 ion implantation penetrates through the pad oxide 301 and is shown by arrow lines corresponding to reference sign 302 in FIG. 2B.

The pad oxide 301 is removed as a pre-existing oxide layer before the formation of the first sacrificial oxide 301.

As shown in FIG. 2C, after the deep N-well 3 ion implantation, an ion-implanted region of the deep N-well 3 is generally annealed. As shown in FIG. 2C, the deep N-well 3 is formed in the whole region of the semiconductor substrate 1, the semiconductor substrate 1 further has a part not formed with the deep N-well at the bottom of the deep N-well 3, and the part, at the bottom of the deep N-well 3, of the semiconductor substrate 1 is not shown.

As can be seen from FIG. 2C, the compactness of the pad oxide 301 is destroyed after the deep N-well 3 ion implantation, and the pad oxide with poor compactness is independently represented by reference sign 301a in FIG. 2C.

Afterwards, as shown in FIG. 2D, the pre-existing oxide layer (namely the pad oxide 301a) on the surface of the semiconductor substrate 1 is removed, wherein the pad oxide 301a is removed by a wet removal process or a plasma removal process.

Afterwards, as shown in FIG. 2E, a first sacrificial oxide 303 is formed on the surface of the semiconductor substrate 1 to replace the pad oxide 301a, so that the influence of ion implantation carried out before subsequent primary phosphorus implantation on the first sacrificial oxide 303 is eliminated to make sure that the first sacrificial oxide 303 has a compact structure. Preferably, the first sacrificial oxide 303 grows by a wet-oxygen oxidization process at a temperature of 1000° C.-1300° C. and has a thickness of 10 Å-100 Å.

After the first sacrificial oxide 303 is formed, the following steps are performed:

Step 1, as shown in FIG. 2F, primary phosphorus implantation is carried out to form a phosphorus-implanted region.

The implantation energy of the primary phosphorus implantation is 100 KeV-300 KeV, and the implantation dose is $1*10^{13}$ cm-2~$1*10^{14}$ cm-2.

Step 2, as shown in FIG. 2F, secondary arsenic implantation is carried out to form a first arsenic-implanted region, wherein the implantation depth of the secondary arsenic implantation is greater than that of subsequent ternary arsenic implantation, and an amorphous layer is formed by the first arsenic-implanted region on the semiconductor substrate 1 within the implantation depth of the first arsenic-implanted region. In FIG. 2F, the primary phosphorus implantation and the secondary arsenic implantation are represented by arrow lines corresponding to reference sign 304. In FIG. 2G, a doped region corresponding to reference sign 4a is an overlay doped region of the phosphorus-implanted region and the first arsenic-implanted region.

The implantation energy of the secondary arsenic implantation is 100 KeV-200 KeV, and the implantation dose is $1*10^{12}$ cm-2-$5*10^{12}$ cm-2.

Step 3, as shown in FIG. 2H, the ternary arsenic implantation is carried out to form a second arsenic-implanted region 4b, wherein the amorphous layer improves the uniformity of the ternary arsenic implantation and decreases the peak doping concentration of the second arsenic-implanted region 4b located on the surface of the semiconductor substrate 1; and the decrease of the peak doping concentration of the second arsenic-implanted region 4b on the surface of the semiconductor substrate 1 makes carriers in a channel further away from the bottom surface of the gate dielectric layer, so that flicker noises are reduced. In FIG. 2H, the ternary arsenic implantation is represented by arrow lines corresponding to reference sign 305. In FIG. 2I, the doped region corresponding to reference sign 4b is the second arsenic-implanted region.

The implantation energy of the ternary arsenic implantation is 50 KeV-100 KeV, and the implantation dose is $1*10^{12}$ cm-2-$5*10^{12}$ cm-2.

Step 4, an annealing process is carried out, and after being annealed, the phosphorus-implanted region, the first arsenic-implanted region and the second arsenic-implanted region 4b are overlaid to form the N-well 4, and the first arsenic-implanted region and the second arsenic-implanted region 4b are overlaid to form a threshold voltage regulation region in the channel region.

Preferably, the temperature of the annealing process in Step 4 is 1000° C.-1300° C.

According to the method in this embodiment of the invention, the primary phosphorus implantation, the secondary arsenic implantation and the ternary arsenic implantation all penetrate through the first sacrificial oxide 303 to penetrate into the semiconductor substrate 1 to make sure that the first sacrificial oxide 303 has a compact structure that is not affected by ion implantation carried out before the primary phosphorus implantation, so that the uniformity of the primary phosphorus implantation, the secondary arsenic implantation and the ternary arsenic implantation is improved, and finally, the doping uniformity of the N-well 4 is improved.

After the annealing process in Step 4 is completed, the first sacrificial oxide 303 is removed.

The method further comprises the following steps to be performed after Step 4:

Step 5, the gate dielectric layer and the gate conductive material layer are sequentially formed on the surface of the semiconductor substrate 1.

Step 6, a formation region of the gate structure is defined by lithography.

Step 7, the gate conductive material layer and the gate dielectric layer are sequentially etched, and the etched gate dielectric layer and the etched gate conductive material layer are overlaid to form the gate structure.

Step 8, a primary gate spacer is formed, and P-type lightly-doped drain implantation is carried out to form lightly-doped drain regions in the active region on two sides of the gate structure separately, wherein the primary gate spacer is generally an oxide layer.

Then, a secondary gate spacer is formed, and P-type heavily-doped drain-source implantation is carried to form a source region and a drain region, which are formed by P+ regions, in the active region on the two sides of the gate structure separately, wherein the secondary gate spacer is an oxide layer or a nitrogen layer.

Step 9, metal silicide grows to form contact holes, an interlayer film and front metal layers. As for process nodes less than 28 nm, the metal silicide is generally nickel silicide. Or, Step 8, P-type heavily-doped source-drain implantation is carried out to form a source region and a drain region, which are formed by P+ regions, in the active region on two sides of the gate structure separately.

Step 9, contact holes, an interlayer film and front metal layers are formed.

The invention is detailed above with reference to specific embodiments, but these embodiments are not intended to limit the invention. Various transformations and improvements can be made by those skilled in the art without deviating from the principle of the invention, and all these transformations and improvements should also fall within the protection scope of the invention.

What is claimed is:

1. A P-type MOSFET, comprising:
   a gate structure formed by overlaying a gate dielectric layer and a gate conductive material layer, wherein:
   the gate dielectric layer is formed on a surface of a semiconductor substrate, a channel region consisting of an N-well is formed in the semiconductor substrate covered with the gate structure, and an inversion channel is formed in a surface of the channel region covered with the gate structure;
   the N-well comprises a phosphorus-implanted region, a first arsenic-implanted region, and a second arsenic-implanted region; and after being annealed, the N well is formed by diffusion and mixing of impurities in the phosphorus-implanted region, the first arsenic-implanted region and the second arsenic-implanted region, and a threshold voltage regulation region in the channel region is formed by diffusion and mixing of impurities in the first arsenic-implanted region and the second arsenic-implanted region; and
   an implantation depth of the first arsenic-implanted region is greater than that of the second arsenic-implanted region, and an amorphous layer is formed by the first arsenic-implanted region on the semiconductor substrate within the implantation depth of the first arsenic-implanted region to improve an implantation uniformity of the second arsenic-implanted region and to decrease a peak doping concentration of the second arsenic-implanted region located on the surface of the semiconductor substrate, so that flicker noises are reduced.

2. The P-type MOSFET according to claim 1, wherein a first sacrificial oxide is used for ion implantation of the phosphorus-implanted region, the first arsenic-implanted region and the second arsenic-implanted region of the N-well and is formed on the semiconductor substrate, and the first sacrificial oxide has a compact structure that is not affected by ion implantation carried out before the ion implantation of the phosphorus-implanted region, the first arsenic-implanted region and the second arsenic-implanted region of the N-well, so that a uniformity of the ion implantation of the phosphorus-implanted region, the first arsenic-implanted region and the second arsenic-implanted region of the N-well is improved; and
   the first sacrificial oxide is removed after the N-well is formed.

3. The P-type MOSFET according to claim 2, wherein a deep N-well is formed in the semiconductor substrate, the N-well is formed in the deep N-well, and the deep N-well is formed by an annealed deep N-well implantation region; and
   ion implantation of the deep N-well implantation region penetrates through a pad oxide, and the pad oxide is removed before the ion implantation of the deep N-well implantation region and before formation of the first sacrificial oxide.

4. The P-type MOSFET according to claim 1, wherein the semiconductor substrate is a silicon substrate.

5. The P-type MOSFET according to claim 4, wherein a field oxide is formed on the semiconductor substrate, an active region is defined by the field oxide, and the P-type MOSFET is formed in the active region.

6. The P-type MOSFET according to claim 5, wherein the gate dielectric layer is made from silicon oxide, silicon oxynitride, or a high-dielectric constant material, and the high-dielectric constant material includes hafnium oxide; and
   the gate conductive material layer is a polysilicon gate; or, the gate conductive material layer is a metal gate.

7. The P-type MOSFET according to claim 5, wherein a source region and a drain region, which are formed by P+ regions, are formed in the active region on two sides of the gate structure, and the gate conductive material layer, the source region and the drain region are connected to a front metal layer via contact holes.

8. A method for manufacturing a P-type MOSFET, wherein a gate structure of the P-type MOSFET is formed by overlaying a gate dielectric layer and a gate conductive material layer, the gate dielectric layer is formed on a surface of a semiconductor substrate, a channel region consisting of an N-well is formed in the semiconductor substrate covered with the gate structure, and an inversion channel is formed in a surface of the channel region covered with the gate structure; and the N-well is formed through the following steps:
   Step 1, carrying out primary phosphorus implantation to form a phosphorus-implanted region;
   Step 2, carrying out secondary arsenic implantation to form a first arsenic-implanted region, wherein an implantation depth of the secondary arsenic implantation is greater than that of a subsequent ternary arsenic implantation, and an amorphous layer is formed by the first arsenic-implanted region on the semiconductor substrate within the implantation depth of the first arsenic-implanted region;
   Step 3, carrying out the ternary arsenic implantation to form a second arsenic-implanted region, wherein the amorphous layer improves a uniformity of the ternary arsenic implantation and decreases a peak doping concentration of the second arsenic-implanted region located on the surface of the semiconductor substrate, so that flicker noises are reduced; and
   Step 4, carrying out an annealing process, the N well is formed by diffusion and mixing of impurities in the phosphorus-implanted region, the first arsenic-implanted region and the second arsenic-implanted region, and a threshold voltage regulation region in the channel region is formed by diffusion and mixing of impurities in the first arsenic-implanted region and the second arsenic-implanted region.

9. The method for manufacturing the P-type MOSFET according to claim 8, wherein the method further comprises the following steps performed before the primary phosphorus implantation in Step 1:
   removing a pre-existing oxide layer on the surface of the semiconductor substrate, and then forming a first sacrificial oxide on the surface of the semiconductor substrate to eliminate an influence of ion implantation carried out before the primary phosphorus implantation on the first sacrificial oxide to make sure that the first sacrificial oxide has a compact structure;
   carrying out the primary phosphorus implantation in Step 1 after the first sacrificial oxide is formed, wherein subsequent primary phosphorus implantation, secondary arsenic implantation and ternary arsenic implantation all penetrate through the first sacrificial oxide to penetrate into the semiconductor substrate, and because the first sacrificial oxide has the compact structure that is not affected by ion implantation carried out before the primary phosphorus implantation, the uniformity of the primary phosphorus implantation, the secondary arsenic implantation and the ternary arsenic implantation is improved; and removing the first sacrificial oxide after the annealing process in Step 4 is completed.

10. The method for manufacturing the P-type MOSFET according to claim 9, wherein the first sacrificial oxide grows by a wet-oxygen oxidization process at a temperature of 1000° C.-1300° C. and has a thickness of 10 Å-100 Å.

11. The method for manufacturing the P-type MOSFET according to claim 9, wherein before the first sacrificial oxide is formed, the method further comprises the step of forming a deep N-well in the semiconductor substrate through the following sub-steps:

forming a pad oxide on the surface of the semiconductor substrate;

carrying out deep N-well ion implantation to form the deep N-well, wherein the deep N-well ion implantation penetrates through the pad oxide; and removing the pad oxide as the pre-existing oxide layer before the first sacrificial oxide is formed.

12. The method for manufacturing the P-type MOSFET according to claim 8, wherein the semiconductor substrate is a silicon substrate; and the method further comprises the step of forming a field oxide on the semiconductor substrate before Step 1, wherein an active region is defined by the field oxide, and the P-type MOSFET is formed in the active region.

13. The method for manufacturing the P-type MOSFET according to claim 12, wherein the method further comprises the following steps to be performed after Step 4:

Step 5, sequentially forming the gate dielectric layer and the gate conductive material layer on the surface of the semiconductor substrate;

Step 6, defining a formation region of the gate structure by lithography;

Step 7, sequentially etching the gate conductive material layer and the gate dielectric layer, and overlaying the etched gate dielectric layer and the etched gate conductive material layer to form the gate structure;

Step 8, forming a primary gate spacer, and carrying out P-type lightly-doped drain implantation to form lightly-doped drain regions in the active region on two sides of the gate structure separately; then forming a secondary gate spacer, and carrying out P-type heavily-doped source-drain implantation to form a rescore region and a drain region, which are formed by P+ regions, in the active region on the two sides of the gate structure separately; and Step 9, growing metal silicide, and forming contact holes, an interlayer film and front metal layers.

14. The method for manufacturing the P-type MOSFET according to claim 9, wherein the pre-existing oxide layer and the first sacrificial oxide are removed by a wet removal process or a plasma removal process.

15. The method for manufacturing the P-type MOSFET according to claim 8, wherein implantation energy of the primary phosphorus implantation is 100 KeV-300 KeV, and an implantation dose is $1*10^{13}$ cm$^{-2}$-$1*10^{14}$ cm$^{-2}$;

implantation energy of the secondary arsenic implantation is 100 KeV-200 KeV, and an implantation dose is $1*10^{12}$ cm$^{-2}$-$5*10^{12}$ cm$^{-2}$;

implantation energy of the ternary arsenic implantation is 50 KeV-100 KeV, and an implantation dose is $1*10^{12}$ cm$^{-2}$-$5*10^{12}$ cm$^{-2}$; and a temperature of the annealing process in Step 4 is 1000° C.-1300° C.

* * * * *